US011953521B2

(12) United States Patent
Ting et al.

(10) Patent No.: US 11,953,521 B2
(45) Date of Patent: Apr. 9, 2024

(54) PROBE CARD

(71) Applicant: Bao Hong Semi Technology Co., Ltd., Hsinchu (TW)

(72) Inventors: Chao-Cheng Ting, Hsinchu (TW); Li-Hong Lu, Hsinchu (TW); Huai-Yi Wang, Hsinchu (TW); Lung-Chuan Tsai, Hsinchu (TW)

(73) Assignee: BAO HONG SEMI TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 17/885,252

(22) Filed: Aug. 10, 2022

(65) Prior Publication Data
US 2024/0053383 A1    Feb. 15, 2024

(51) Int. Cl.
*G01R 1/073*    (2006.01)
(52) U.S. Cl.
CPC ................. *G01R 1/07342* (2013.01)
(58) Field of Classification Search
CPC .................................. G01R 1/07342
See application file for complete search history.

(56) References Cited

U.S. PATENT DOCUMENTS

| 8,692,570 | B2 | 4/2014 | Lou et al. | |
| 2008/0100291 | A1* | 5/2008 | Mayder | H05K 1/0206 |
| | | | | 29/830 |
| 2017/0082657 | A1* | 3/2017 | Kimura | G01R 1/18 |

FOREIGN PATENT DOCUMENTS

| JP | 2013250146 A | * 12/2013 |
| TW | I411785 B | 10/2013 |
| TW | I574013 B | 3/2017 |

OTHER PUBLICATIONS

English machine translation of JP-2013250146-A (Year: 2013).*

* cited by examiner

*Primary Examiner* — Lee E Rodak
(74) *Attorney, Agent, or Firm* — MUNCY, GEISSLER, OLDS & LOWE, P.C.

(57) ABSTRACT

Provided is a probe card, comprising a guide plate and a shielding structure of single-layer or multi-layer. The guide plate comprises an upper surface, a lower surface, and at least one guide hole passing through the upper surface and the lower surface, and the guide hole is provided with an inner wall surface. At least one layer of the shielding structure is made of an electromagnetic absorption material or an electromagnetic reflection material, and the shielding structure is not connected to a ground. Each layer of the shielding structure is formed on the inner wall surface of the guide hole by means of atomic layer deposition or atomic layer etching, and a thickness of each layer is less than 1000 nm.

3 Claims, 4 Drawing Sheets

PROBE CARD

FIELD OF THE INVENTION

The present invention relates to a device for testing an integrated circuit, particularly to a probe card.

BACKGROUND OF THE INVENTION

A probe test is a common technique among integrated circuit test methods, and a probe card is one of the most crucial elements in a test device for performing a probe test. However, as distances between contact points on an integrated circuit are gradually decreased, distances between probes are reduced as well, causing signals between the probes to interfere with each other during testing of integrated circuits, and accordingly affecting a measurement result.

In order to solve the problem of signal interference, prior arts such as Taiwan Patent Nos. TW 1574013 B and TW 1411785 B, and U.S. Pat. No. 8,692,570B2 can be referred to. In all of the above-mentioned patents, an insulating layer and a shielding layer are coated on the outer surface of each metal probe to achieve shielding. However, since each probe is covered by the insulating layer and the shielding layer, the production process is time-consuming and requires a lot of work, and production costs are high. When a probe fails or is damaged, the cost of changing the probe is also increased. In addition, as the outer surface of each probe is covered by the insulating layer and the shielding layer, the precision of the probe itself is affected, and the probability of damaging the probe is increased.

In addition, the shielding layer of an existing probe card is made of a common metal material, so it is necessary to further connect the shielding layer to a ground so as to achieve shielding. Nevertheless, grounding requires additional lines and circuits, thereby increasing manufacturing complexity and the complexity of the structure.

Therefore, how to simplify the structure and production processes of a probe card while achieving shielding is a problem to be solved by those skilled in the art.

BRIEF DESCRIPTION OF THE DRAWINGS

The designated representative drawing is FIG. 3.

SUMMARY OF THE INVENTION

Figure 1:
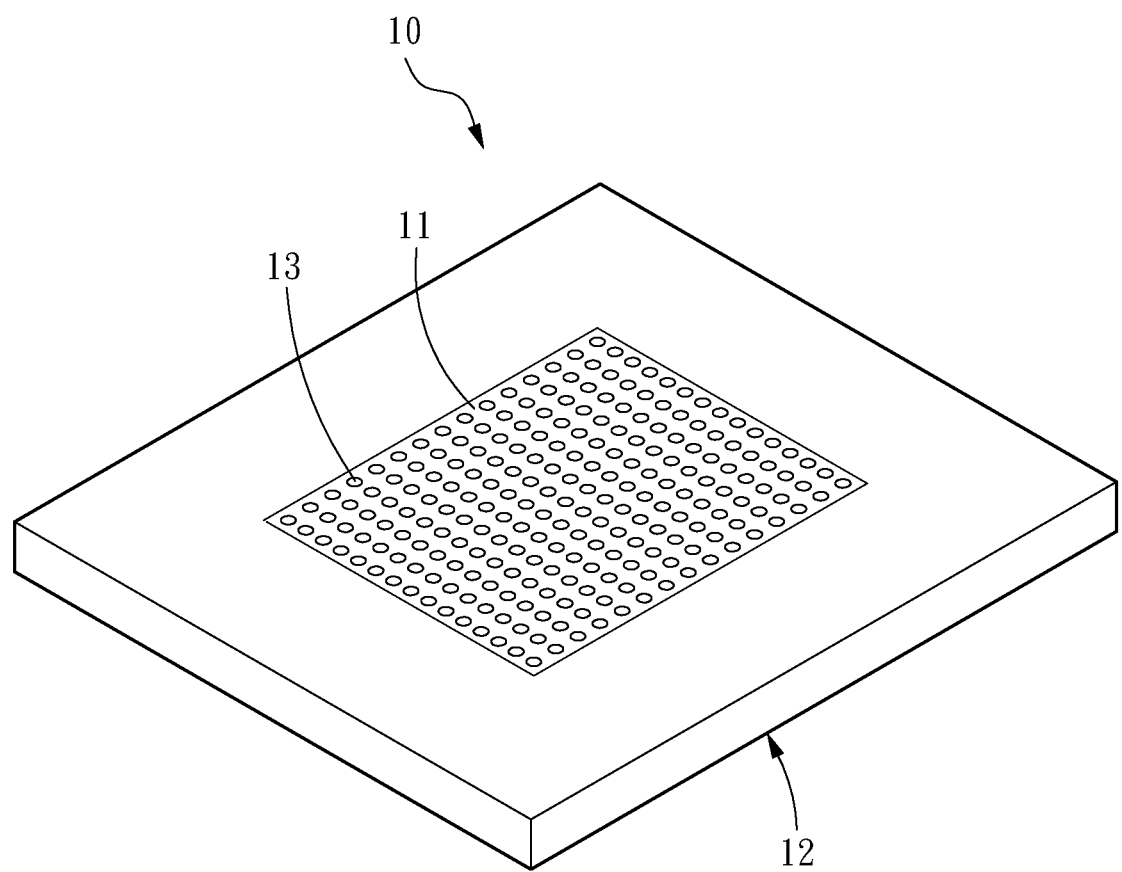
FIG. 1 is a three-dimensional schematic diagram of a probe card in an embodiment of the present invention.
Figure 2:
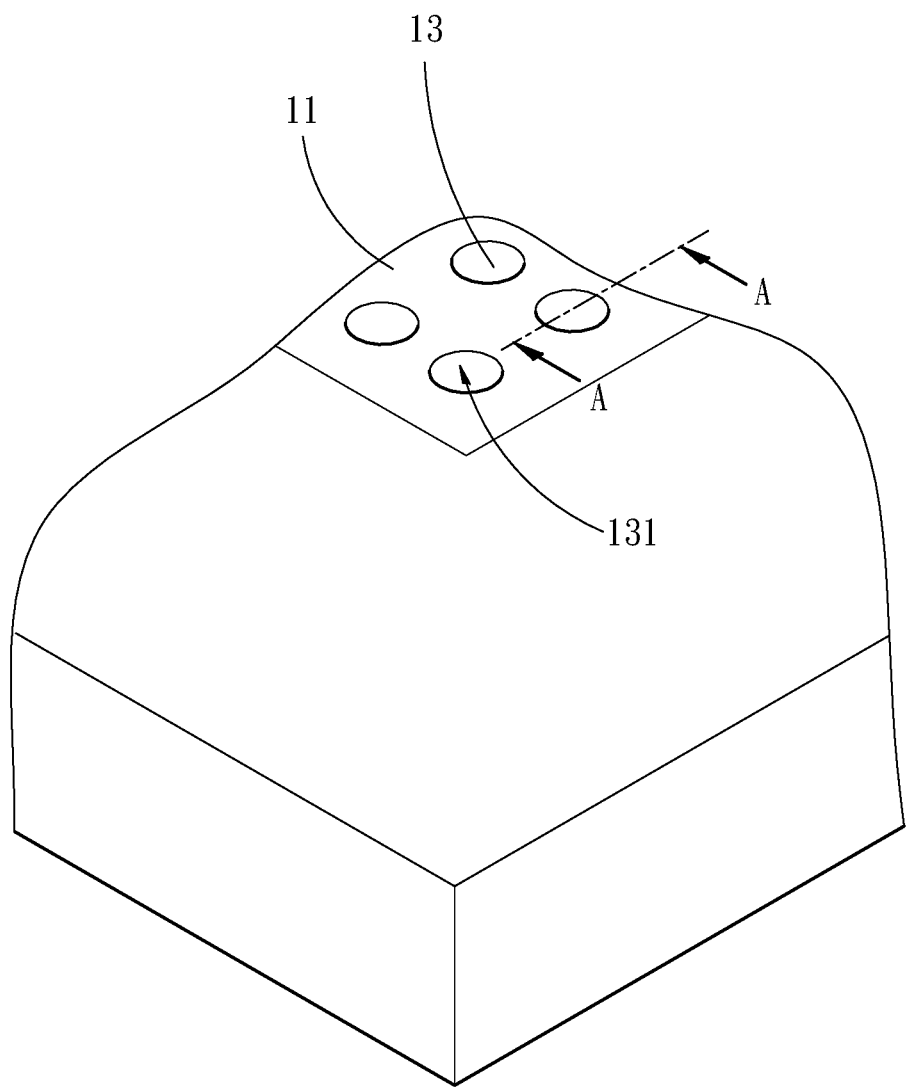
FIG. 2 is a partially enlarged three-dimensional schematic diagram of a probe card in an embodiment of the present invention.

The present invention aims to solve the problem in the prior art in which a shielded probe card requires a very precise and complicated processes as well as high costs to deposit a shielding structure on each probe and to provide additional lines and circuits required for grounding.

In order to achieve the above-mentioned objective, provided in the present invention is a probe card, comprising a guide plate and a shielding structure of single-layer or multi-layer. The guide plate comprises an upper surface, a lower surface, and at least one guide hole passing through the upper surface and the lower surface, and the guide hole is provided with an inner wall surface. At least one layer of the shielding structure is made of an electromagnetic absorption material or an electromagnetic reflection material, and the shielding structure is not connected to the ground. Each layer of the shielding structure is formed on the inner wall surface of the guide hole by atomic layer deposition or atomic layer etching, and a thickness of each layer is less than 1000 nm.

DETAILED DESCRIPTION OF THE PREFERRED EMBODIMENTS

Terms used herein are merely used to illustrate a specific embodiment and are not intended to limit the present invention. As used herein, the singular forms "a", "an", and "the" include the plural forms as well, unless the context clearly indicates otherwise.

Directional terms used herein, for example, upper, lower, left, right, front, back, and derivative words or synonyms thereof relate to the orientations of elements in the accompanying drawings and are not intended to limit the present invention, unless the context clearly indicates otherwise. The detailed description and technical content involved in the present invention are described below in combination with the drawings:

Referring to FIG. 1, FIG. 2, FIG. 3 and FIG. 4, disclosed in the present invention is a probe card, particularly a probe card that is capable of providing shield effect (EMI shielding) without grounding. Meanwhile, the probe card according to the present invention does not require a shielding layer to be formed on each probe.

The probe card according to an exemplary embodiment of the present invention includes a guide plate 10, at least one shielding structure 20 and a plurality of probes 30. The guide plate 10 includes an upper surface 11, a lower surface 12, and at least one guide hole 13 passing through the upper surface 11 and the lower surface 12. The guide hole 13 is configured to guide a tip 31 of the probe 30 from the upper surface 11 to the lower surface 12. The probe 30 is hold by the guide hole 13 and contacts a wafer to be tested. In the present invention, the probe 30 is not deposited with a shielding layer or a shielding material. Namely, the probe 30 is absence of any shielding structure.

The guide hole 13 includes an inner wall surface 131. The guide hole 13 can be formed on the guide plate 10 in an array or as a pattern in accordance with an application requirement. In the present embodiment, a cross-section of the guide hole 13 is circular. In other embodiments, the cross-section of the guide hole 13 may be in another shape such as a triangular shape, a square shape, a pentagonal shape, or other polygonal shapes and the like.

In the present invention, the shielding structure 20 may be single-layer or multi-layer. Each layer of the shielding structure 20 is formed on the inner wall surface 131 of the guide hole 13 by atomic layer deposition (ALD) or atomic layer etching (ALE). A thickness of each layer is less than 1000 nm. By using the ALD or ALE, an extremely thin and uniform multilayer film can be produced in the small guide hole 13 without deposition on each of the probes 30. At least one layer of the shielding structure 20 is made of an electromagnetic absorption material or an electromagnetic reflection material. In additional to the electromagnetic absorption material and the electromagnetic reflection material, in some embodiments, the shielding structure 20 can further include at least one layer of an insulating material, which is formed by depositing a material having better insulation properties (low dielectric constant).

Particularly, the shielding structure 20 of the present invention is not connected to a ground. Further, in an embodiment, each layer of the shielding structure 20 is not connected to the ground. In addition, the shielding structure 20 of the present invention is directly deposited in the guide hole 13. With the above design of the probe card, the shielding structure 20 can be formed by a single deposition process for one guide plate 10, which could accommodate a plenty of the probes 30, thus there is no need to respectively deposit a shielding structure onto each of the probes 30. Therefore, the process is much simpler and the fabrication cost is reduced. Additionally, in absence of the shielding structure attached onto the probe 30, there is no need to change/replace a damaged probe.

The electromagnetic absorption material may be a conductive metal or alloy. For example, the electromagnetic absorption material may be aluminum, tungsten, platinum, titanium, gold, iron, or a cobalt-nickel alloy. The electromagnetic reflection material may be an oxide or a nitride. For example, the electromagnetic reflection material may be silicon nitride (SiN), aluminum nitride (AlN), titanium nitride (TiN), tantalum nitride (TaN), cobalt monoxide (CoO), nickel oxide (NiO), ferric oxide ($Fe_2O_3$) or $CoTiO_2$. The insulating material may be an oxide, for example, aluminum oxide ($Al_2O_3$) or silicon dioxide ($SiO_2$).

In some embodiments, the shielding structure 20 may be or may include a multi-layer structure of $Al_2O_3/CoO/Al_2O_3$, a multi-layer structure of $Al_2O_3/AlN/Al_2O_3$, a multi-layer structure of $AlN/Al_2O_3/Fe_2O_3/AlN/Al_2O_3$, a multi-layer structure of $SiN/SiO_2$ or a multi-layer structure of $SiN/SiO_2/AlN/SiO_2$. In some embodiments, the shielding structure 20 may be formed by stacking the above-mentioned multilayer structures together, for example, $Al_2O_3/CoO/Al_2O_3/Al_2O_3/CoO/Al_2O_3/Al_2O_3/CoO/Al_2O_3$, $SiN/SiO2/SiN/SiO_2/SiN/SiO_2$ and the like. It can be understood that the above-mentioned multilayer structure includes at least one layer of the electromagnetic absorption material or the electromagnetic reflection material and selectively includes at least one layer of the insulating material.

Figure 3:
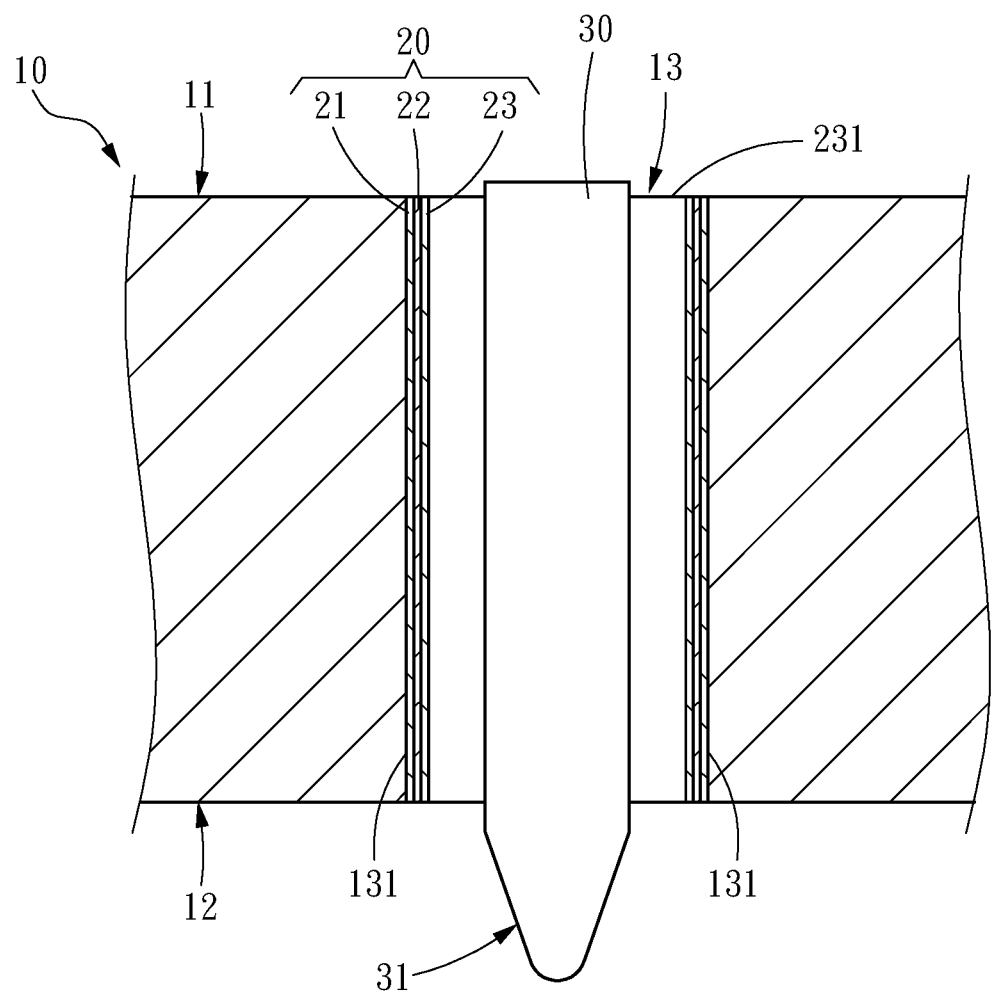
FIG. 3 is a schematic cross-sectional view along A-A of FIG. 2.
Figure 4:
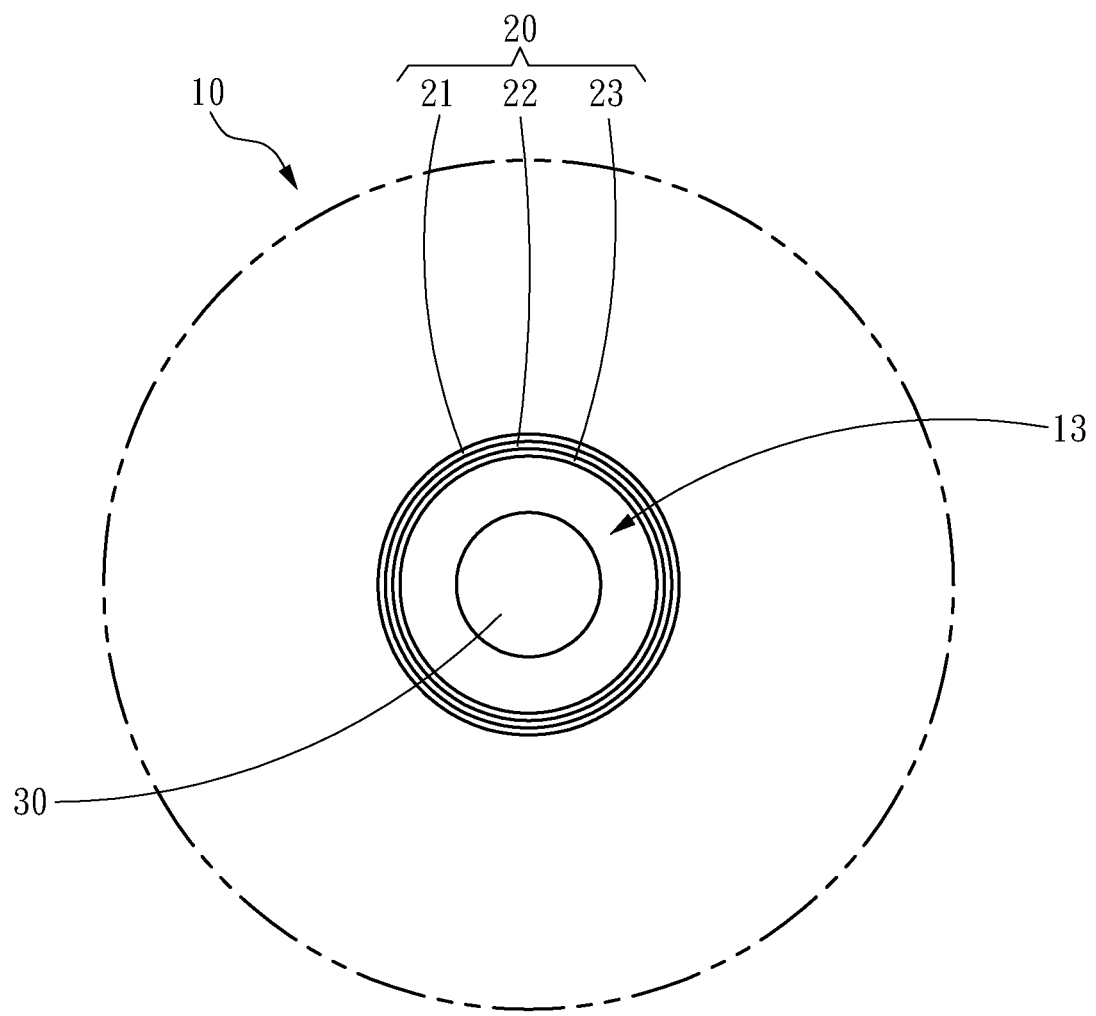
FIG. 4 is a schematic top view of FIG. 2.

Referring to FIG. 3 to FIG. 4, in the present embodiment, the shielding structure 20 is a three-layer structure and is arranged on the inner wall surface 131 of the guide hole 13. The shielding structure 20 includes a first layer 21, a shielding layer 22, and a second layer 23. The first layer 21 and the second layer 23 are made of the insulating material, and the insulating materials of the first layer 21 and the second layer 23 are the same or different. The shielding layer 22 is the electromagnetic absorption material or the electromagnetic reflection material. The first layer 21 is deposited on the inner wall surface 131, the shielding layer 22 is deposited on the first layer 21, and the second layer 23 is deposited on the shielding layer 22. That is, the first layer 21, the shielding layer 22 and the second layer 23 are sequentially deposited and stacked in a direction from the inner wall surface 131 to a central axis of the guide hole 13. During operation, the probe 30 is inserted into an opening 231 defined and surrounded by the second layer 23. The probe 30 is surrounded by the first layer 21, the shielding layer 22 and the second layer 23, so that a test signal transmitted on the probe 30 is less likely to suffer from distortion caused by interference (coupling) from an adjacent probe, the integrity of the test signal is improved, and electrical properties of the integrated circuit can be measured accurately.

In an embodiment, a diameter of the guide hole 13 is less than 1 mm, and a diameter of the probe 30 is less than 50 lam. Thicknesses of the first layer 21, the shielding layer 22 and the second layer 23 are respectively less than 1000 nm. In an embodiment, the thicknesses of each layer of the shielding layer 22 are respectively less than 500 nm. In some embodiments, the thicknesses of each layer of the shielding layer 22 are respectively between 100 nm and 500 nm. By controlling the diameter of the guide hole 13 and a thickness of the shielding structure 20, the probe can be inserted into the guide hole 13 without contacting the second layer 23, so as to prevent the shielding structure 20 from being damaged during probe installation, and prevent measurement precision from being dropping. Due to the three-layered shielding structure 20, internal reflection of an electromagnetic wave will be occurred, thereby reducing an intensity of the electromagnetic wave and preventing electromagnetic interference.

In conclusion, the shielding structure 20 of the present invention does not need to be connected to the ground by selection of structure and material, such as a ground circuit or a ground potential, thereby simplifying structure design of the probe card system. Moreover, by atomic layer deposition (or atomic layer etching) technology, the shielding structure can be deposited in a small guide hole of the probe card, and the shielding structure can be deposited in all of the guide holes through a single deposition process without depositing the shielding structure onto each of the probes, thereby reducing numbers of depositions and lowering the cost of probe changing. In addition, the present invention uses the shielding structure to solve the problem in which probes are subjected to signal interference during testing of semiconductor devices, thereby improving the efficiency for testing a semiconductor device having high wiring density.

What is claimed is:

1. A probe card, comprising:
a guide plate, having an upper surface, a lower surface, and at least one guide hole passing through the upper surface and the lower surface, the guide hole being provided with an inner wall surface; and
a shielding structure of multi-layer, comprising a first layer deposited on the inner wall surface, a shielding layer deposited on the first layer, and a second layer deposited on the shielding layer, wherein the shielding layer is made of an electromagnetic absorption material or an electromagnetic reflection material, the first layer and the second layer are made of same or different insulating materials, each layer of the shielding structure is not connected to a ground, each layer of the shielding structure is formed by atomic layer deposition or atomic layer etching, and a thickness of each layer is less than 1000 nm.

2. The probe card according to claim 1, wherein the electromagnetic absorption material is aluminum, tungsten, platinum, titanium, gold, iron, or a cobalt-nickel alloy.

3. The probe card according to claim 1, wherein the electromagnetic reflection material is silicon nitride (SiN), aluminum nitride (AlN), titanium nitride (TiN), tantalum nitride (TaN), cobalt monoxide (CoO), nickel oxide (NiO), ferric oxide ($Fe_2O_3$) or $CoTiO_2$.

* * * * *